US00RE45555E

(19) United States
(12) Reissued Patent
Yamaguchi

(10) Patent Number: US RE45,555 E
(45) Date of Reissued Patent: Jun. 9, 2015

(54) POWER SUPPLY APPARATUS, AND IMAGE FORMING APPARATUS HAVING THE SAME

(75) Inventor: Atsuhiko Yamaguchi, Tokyo (JP)

(73) Assignee: CANON KABUSHIKI KAISHA, Tokyo (JP)

(21) Appl. No.: 13/175,149

(22) Filed: Jul. 1, 2011

Related U.S. Patent Documents

Reissue of:
(64) Patent No.: 7,557,488
Issued: Jul. 7, 2009
Appl. No.: 11/677,397
Filed: Feb. 21, 2007

(30) Foreign Application Priority Data

Feb. 24, 2006 (JP) ..... 2006-048978

(51) Int. Cl.
*H01L 41/107* (2006.01)
*H01L 41/04* (2006.01)

(52) U.S. Cl.
CPC ..... *H01L 41/044* (2013.01); *H01L 41/107* (2013.01)

(58) Field of Classification Search
USPC ..... 310/317–319
See application file for complete search history.

(56) References Cited

U.S. PATENT DOCUMENTS

| | | | | |
|---|---|---|---|---|
| 5,341,061 | A | 8/1994 | Zaitsu | |
| 5,563,478 | A * | 10/1996 | Suganuma | 318/116 |
| 5,923,542 | A * | 7/1999 | Sasaki et al. | 363/16 |
| 6,003,976 | A * | 12/1999 | Tani et al. | 347/55 |
| 6,075,325 | A * | 6/2000 | Kouno et al. | 315/307 |
| 6,411,008 | B1 * | 6/2002 | Otsubo et al. | 310/316.01 |
| 2001/0035698 | A1 * | 11/2001 | Nakatsuka et al. | 310/318 |
| 2006/0220495 | A1 * | 10/2006 | Yamaguchi et al. | 310/318 |

FOREIGN PATENT DOCUMENTS

| | | | |
|---|---|---|---|
| JP | 05-127454 | A | 5/1993 |
| JP | 05-284736 | A | 10/1993 |
| JP | 10-127051 | A | 5/1998 |
| JP | 10-235920 | A | 9/1998 |
| JP | 11-206113 | A | 7/1999 |
| JP | 2001-314091 | A | 11/2001 |
| JP | 2003-157990 | A | 5/2003 |

OTHER PUBLICATIONS

Office Action issued on Oct. 8, 2010, in JPA 2006-048978, a counterpart of the present application.
Office Action issued on Aug. 31, 2012, in counterpart Japanese Application No. 2010-273007.
Office Action issued on Oct. 8, 2010, in a Japanese counterpart of the present application.

* cited by examiner

*Primary Examiner* — Derek Rosenau
(74) *Attorney, Agent, or Firm* — Fitzpatrick, Cella, Harper & Scinto

(57) ABSTRACT

A power supply apparatus with a plurality of power supply circuits each having a piezoelectric transformer and a voltage-controlled oscillator which generates a signal at an operating frequency used to drive the piezoelectric transformer in accordance with a control signal, includes a frequency-dividing circuit which divides the operating frequency generated by a voltage-controlled oscillator in at least one power supply circuit, and outputs a signal at a driving frequency to drive a piezoelectric transformer in the one power supply circuit. When at least one power supply circuit and remaining power supply circuits output voltages, the operating frequency generated by the voltage-controlled oscillator in the one power supply circuit is controlled to be higher than the operating frequency generated by the voltage-controlled oscillator in another power supply circuit.

16 Claims, 13 Drawing Sheets

FIG. 8

| 142Ya | 142Yb | 142Yc | FREQUENCY DIVISION RATIO |
|---|---|---|---|
| 142Ma | 142Mb | 142Mc | |
| 1 | 1 | 1 | Reserve |
| 1 | 1 | 0 | Reserve |
| 1 | 0 | 1 | 32 |
| 1 | 0 | 0 | 16 |
| 0 | 1 | 1 | 8 |
| 0 | 1 | 0 | 4 |
| 0 | 0 | 1 | 2 |
| 0 | 0 | 0 | 1 |

POWER SUPPLY APPARATUS, AND IMAGE FORMING APPARATUS HAVING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This application is an application for reissue of U.S. Pat. No. 7,557,448, issued on Jul. 7, 2009, which is hereby incorporated by reference, as if fully set forth herein. U.S. Pat. No. 7,557,488 matured from U.S. application Ser. No. 11/677,397, filed Feb. 21, 2007.*

*Notice: More than one reissue application has been filed for the reissue of U.S. Pat. No. 7,557,488. The reissue applications are U.S. application Ser. No. 13/244,966, filed Sep. 26, 2011 and which is a reissue continuation of the present application Ser. No. 13/175,149, filed Jul. 1, 2011, both of which may reissue from U.S. Pat. No. 7,577,488.*

BACKGROUND OF THE INVENTION

1. Field of the Invention

The present invention relates to a power supply apparatus suitable for an image forming apparatus which forms an image by an electrophotographic process and, more particularly, to a power supply apparatus using a piezoelectric transformer and an image forming apparatus using the power supply apparatus.

2. Description of the Related Art

When an image forming apparatus which forms an image by an electrophotographic process adopts a direct transfer system of transferring an image by bringing a transfer member into contact with a photosensitive member, the transfer member uses a conductive rubber roller having a conductive rotating shaft. In this case, driving of the transfer member is controlled to match the process speed of the photosensitive member.

A voltage applied to the transfer member is a DC bias voltage. At this time, the polarity of the DC bias voltage is the same as that of a transfer voltage for general corona discharge. To achieve satisfactory transfer using the transfer roller, a voltage of generally 3 kV or more (the required current is several μA) must be applied to the transfer roller. This high voltage necessary for the above image forming process is conventionally generated using a wire-wound electromagnetic transformer. The electromagnetic transformer is made up of a copper wire, bobbin, and core. When the electromagnetic transformer is used in application of a voltage of 3 kV or more, the leakage current must be minimized at each portion because the output current value is as small as several μA. For this purpose, the windings of the transformer must be molded with an insulator, and the transformer must be made large in comparison with the magnitude of the supply power. This inhibits downsizing and weight reduction of a high-voltage power supply apparatus.

In order to compensate for these drawbacks, generation of a high voltage using a flat, light-weight, high-output piezoelectric transformer is examined. By using a piezoelectric transformer formed from ceramic, the piezoelectric transformer can generate a high voltage at higher efficiency than that of the electromagnetic transformer. Since electrodes on the primary and secondary sides can be spaced apart from each other regardless of coupling between the primary and secondary sides, no special molding is necessary for insulation. The piezoelectric transformer brings an advantage of making a high-voltage generation apparatus compact and lightweight.

For example, Japanese Patent Laid-Open No. 11-206113 discloses a high-voltage generation apparatus using a piezoelectric transformer.

A high-voltage power supply circuit using a piezoelectric transformer will be explained with reference to FIG. 13. In FIG. 13, reference numeral 101Y denotes a piezoelectric transformer (piezoelectric ceramic transformer) for a high-voltage power supply. Diodes 102Y and 103Y and a high-voltage capacitor 104Y rectify and smooth an output from the piezoelectric transformer 101Y to a positive voltage, and a transfer roller (not shown) serving as a load receives it. Resistors 105Y, 106Y, and 107Y divide the output voltage, and the inverting input terminal (negative terminal) of an operational amplifier 109Y receives it via a protection resistor 10Y. The non-inverting input terminal (positive terminal) of the operational amplifier receives, via a resistor 114Y, a high-voltage power supply control signal Vcont which serves as an analog signal and is input to a connection terminal 118Y from a DC controller 201. The operational amplifier 109Y, the resistor 114Y, and a capacitor 113Y construct an integrating circuit. The operational amplifier 109Y receives control signal Vcont smoothed by an integral time constant determined by the component constants of the resistor and capacitor. The output terminal of the operational amplifier 109Y is connected to a voltage-controlled oscillator (VCO) 110Y. A transistor 111Y whose output terminal is connected to an inductor 112Y is driven to supply power to the primary side of the piezoelectric transformer.

The high-voltage power supply unit of an electrophotographic image forming apparatus comprises a plurality of high-voltage power supply circuits using the piezoelectric transformer shown in FIG. 13. The high-voltage power supply unit corresponding to image forming units for, e.g., yellow (Y), magenta (M), cyan (C), and black (BK) outputs biases for charging, development, transfer, and the like to form images.

In the above example, pluralities of piezoelectric transformers and control circuits are arranged in the high-voltage power supply unit, and a plurality of bias voltages are output to form images. Especially, a high-voltage power supply unit mounted in a color image forming apparatus of a tandem system requires four bias output circuits for charging, development, transfer, and the like in correspondence with formation of cyan, magenta, yellow, and black images. The circuits corresponding to cyan (C), magenta (M), yellow (Y), and black (BK) colors are controlled at almost the same bias output voltage. Piezoelectric transformers mounted in the high-voltage power supply unit are driven at almost the same frequency (close frequencies) in the respective bias output circuits (C, M, Y, and BK) for charging, development, transfer, and the like.

A plurality of piezoelectric transformers are driven at close frequencies to output the same bias voltages. In this case, adjacent piezoelectric transformers interfere with each other via the power supply line or depending on electrostatic capacitive coupling or the like, which makes it difficult to improve the output precision of a high bias voltage. Alternatively, the image quality may degrade due to, e.g., generation of fluctuations of a high bias voltage by the interference frequency.

In order to prevent an image from being influenced by the precision of a high bias voltage, piezoelectric transformers are arranged at large intervals. In order to suppress interference via the power supply line, the pattern length is increased or the capacitance of a decoupling capacitor is increased in designing the pattern of the power supply line.

However, it is difficult to analyze these measures by theoretical calculation. Many experiments are required to determine whether the above measures can solve the problem, and concrete measurements must be taken where possible. This prolongs the period of product development. Even when these measures can solve the problem, the high-voltage power supply unit can hardly achieve downsizing and a high image quality at the same time.

The present invention has been proposed to solve the conventional problems, and has as its object to provide a power supply apparatus using piezoelectric transformers which suppresses the interference between the driving frequencies of the piezoelectric transformers, implements downsizing and a high image quality, and requires no experimental measure.

It is another object of the present invention to provide an image forming apparatus having the power supply apparatus.

SUMMARY OF THE INVENTION

According to the present invention, the foregoing object is attained by providing a power supply apparatus with a plurality of power supply circuits each having a piezoelectric transformer and a voltage-controlled oscillator which generates a signal at an operating frequency used to drive the piezoelectric transformer in accordance with a control signal, comprising:

a frequency-dividing circuit which divides the operating frequency generated by a voltage-controlled oscillator in at least one power supply circuit, and outputs a signal at a driving frequency to drive a piezoelectric transformer in the one power supply circuit, wherein when the at least one power supply circuit and remaining power supply circuits output voltages, the operating frequency generated by the voltage-controlled oscillator in the one power supply circuit is controlled to be higher than the driving frequency.

According to the present invention, the foregoing object is attained by providing an image forming apparatus comprising:

the above mentioned power supply apparatus; and an image forming unit adapted to form a toner image, wherein the image forming unit uses a voltage supplied from the power supply apparatus.

The present invention can provide a power supply apparatus using piezoelectric transformers, which suppresses the interference between the driving frequencies of the piezoelectric transformers, implements downsizing and a high image quality, and requires no experimental measurements.

The present invention can also provide an image forming apparatus having the power supply apparatus.

Further features of the present invention will become apparent from the following description of exemplary embodiments (with reference to the attached drawings).

BRIEF DESCRIPTION OF THE DRAWINGS

FIG. 8 is a table for explaining the setting of a frequency division ratio in the transfer high-voltage power supply using the piezoelectric transformer according to the second embodiment;

DESCRIPTION OF THE EMBODIMENTS

First Embodiment

Figure 2:
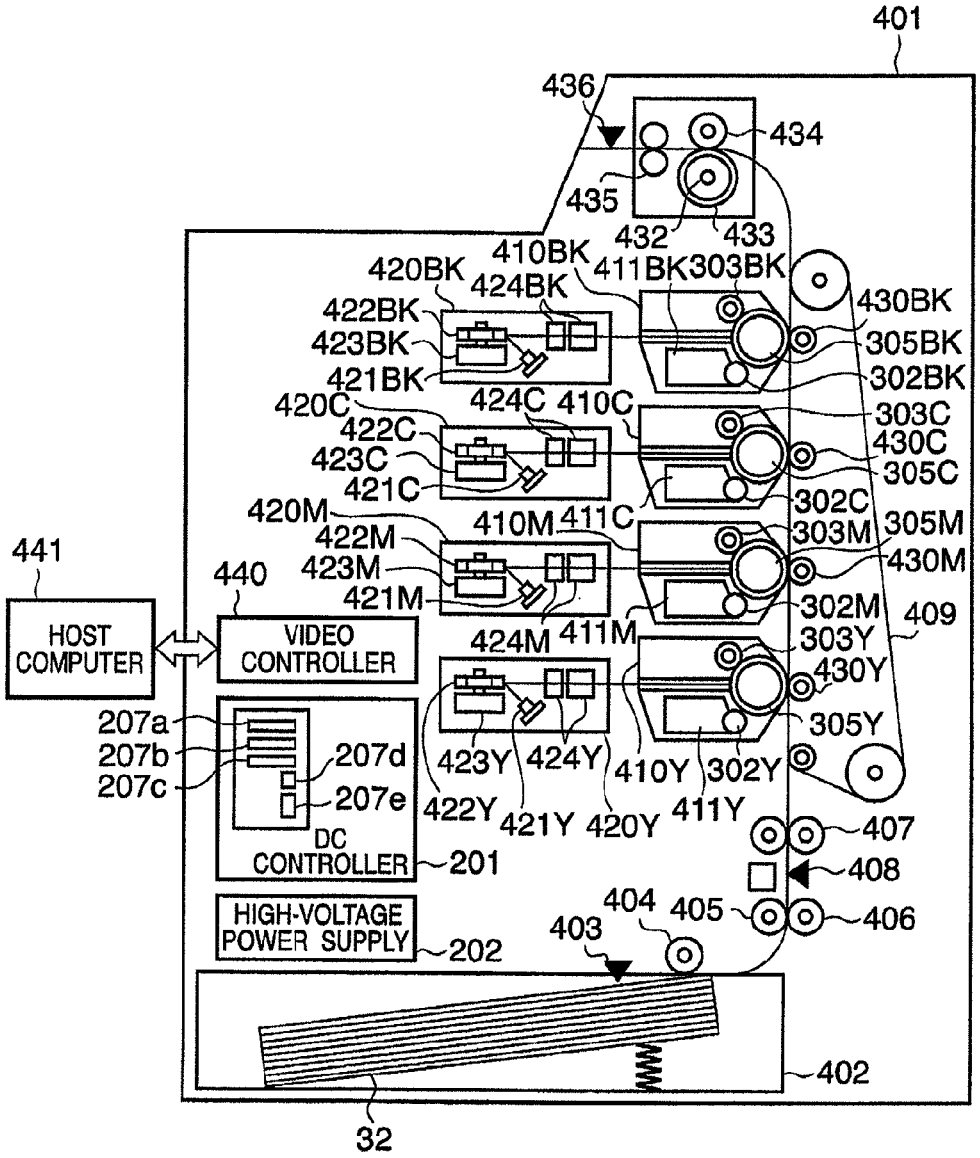
FIG. 2 is a view showing the arrangement of an image forming apparatus having a high-voltage power supply apparatus using a piezoelectric transformer according to the first embodiment.

The first embodiment of the present invention will be described below with reference to the accompanying drawings. FIG. 2 is a view showing an image forming apparatus (to be referred to as a "color laser printer" hereinafter) having a high-voltage power supply apparatus 202 using a piezoelectric transformer according to this embodiment.

A color laser printer 401 comprises a deck 402 which stores recording paper 32, and a deck paper presence/absence sensor 403 which detects the presence/absence of the recording paper 32 in the deck 402. The color laser printer 401 also comprises a pickup roller 404 which picks up the recording paper 32 from the deck 402, and a deck paper feed roller 405 which conveys the recording paper 32 picked up by the pickup roller 404. The color laser printer 401 further comprises a retarding roller 406 which is paired with the deck paper feed roller 405 and prevents multi-feed of the recording paper 32.

A registration roller pair 407 which synchronously conveys the recording paper 32, and a pre-registration sensor 408 which detects conveyance of the recording paper 32 to the registration roller pair 407 are arranged downstream of the deck paper feed roller 405. An electrostatic chuck/convey/ transfer belt (to be referred to as "ETB" hereinafter) 409 is arranged downstream of the registration roller pair 407. Images are formed on the ETB 409 by image forming units made up of process cartridges 410Y, 410M, 410C, and 410BK and scanner units 420Y, 420M, 420C, and 420BK for four colors (Y, M, C, and BK). The formed images are sequentially superposed on each other by transfer rollers 430Y, 430M, 430C, and 430BK to form a color image. The color image is transferred and conveyed on the recording paper 32.

A pair of a pressurizing roller 434 and a fixing roller 433 which incorporates a heater 432 in order to thermally fix a toner image transferred on the recording paper 32 are arranged on the downstream side. Further, a fixing/discharge roller pair 435 which conveys the recording paper 32 from the fixing roller, and a fixing/discharge sensor 436 which detects conveyance from the fixing unit are arranged.

Each scanner unit 420 comprises a laser unit 421, and a polygon mirror 422, scanner motor 423, and image forming lens group 424 for scanning each photosensitive drum 305 with a laser beam from the laser unit 421. A laser beam emitted by the laser unit 421 is modulated based on an image signal sent from a video controller 440.

Each process cartridge 410 comprises the photosensitive drum 305, a charging roller 303, a developing roller 302, and a toner storage vessel 411 which are necessary for a known electrophotographic process. The process cartridge 410 is detachable from the color laser printer 401.

The video controller 440 receives image data sent from an external device 441 such as a personal computer (host computer), and bitmaps the image data into bitmap data to generate an image signal for forming an image.

Reference numeral 201 denotes a DC controller serving as the control unit of the laser printer. The DC controller 201 is configured by an MPU (microcomputer) 207, various input/output control circuits (not shown), and the like. The MPU 207 has a RAM 207a, ROM 207b, timer 207c, digital input/output port 207d, and D/A port 207e.

The high-voltage power supply unit (high-voltage power supply apparatus) 202 comprises a charging high-voltage power supply (not shown) and a development high-voltage power supply (not shown) which correspond to each process cartridge 410 (Y, M, C, or BK), and a transfer high-voltage power supply which corresponds to each transfer roller 430 and uses a piezoelectric transformer capable of outputting a high voltage.

The arrangement of the transfer high-voltage power supply using the piezoelectric transformer will be explained with reference to FIG. 1. The arrangement of the transfer high-voltage power supply (to be also simply referred to as a "transfer high-voltage power supply" hereinafter) using the piezoelectric transformer according to the first embodiment is effective for both positive- and negative-voltage output circuits. A transfer high-voltage power supply which typically requires a positive voltage will be explained.

The transfer high-voltage power supply includes four circuits in correspondence with the transfer rollers 430Y, 430M, 430C, and 430BK for yellow (Y), magenta (M), cyan (C), and black (BK). These circuits have the same circuit arrangement, and FIG. 1 illustrates two typical circuits for yellow (Y) and magenta (M) (the reference numeral representing each circuit is suffixed with Y or M for discrimination). However, the essentials of the present invention are not limited to these two circuits, and can also be applied to the arrangement of a transfer high-voltage power supply having four or more circuits.

The image forming apparatus according to this embodiment of the present invention includes a plurality of color stations which form images of different colors. The image forming apparatus includes a plurality of high-voltage power supply circuits each having a piezoelectric transformer to output a voltage to be used by each color station (Y, M, C, or BK). In the following description, the circuits are respectively called a "Y-station high-voltage circuit", "M-station high-voltage circuit", "C-station high-voltage circuit", and "BK-station high-voltage circuit".

Figure 1:
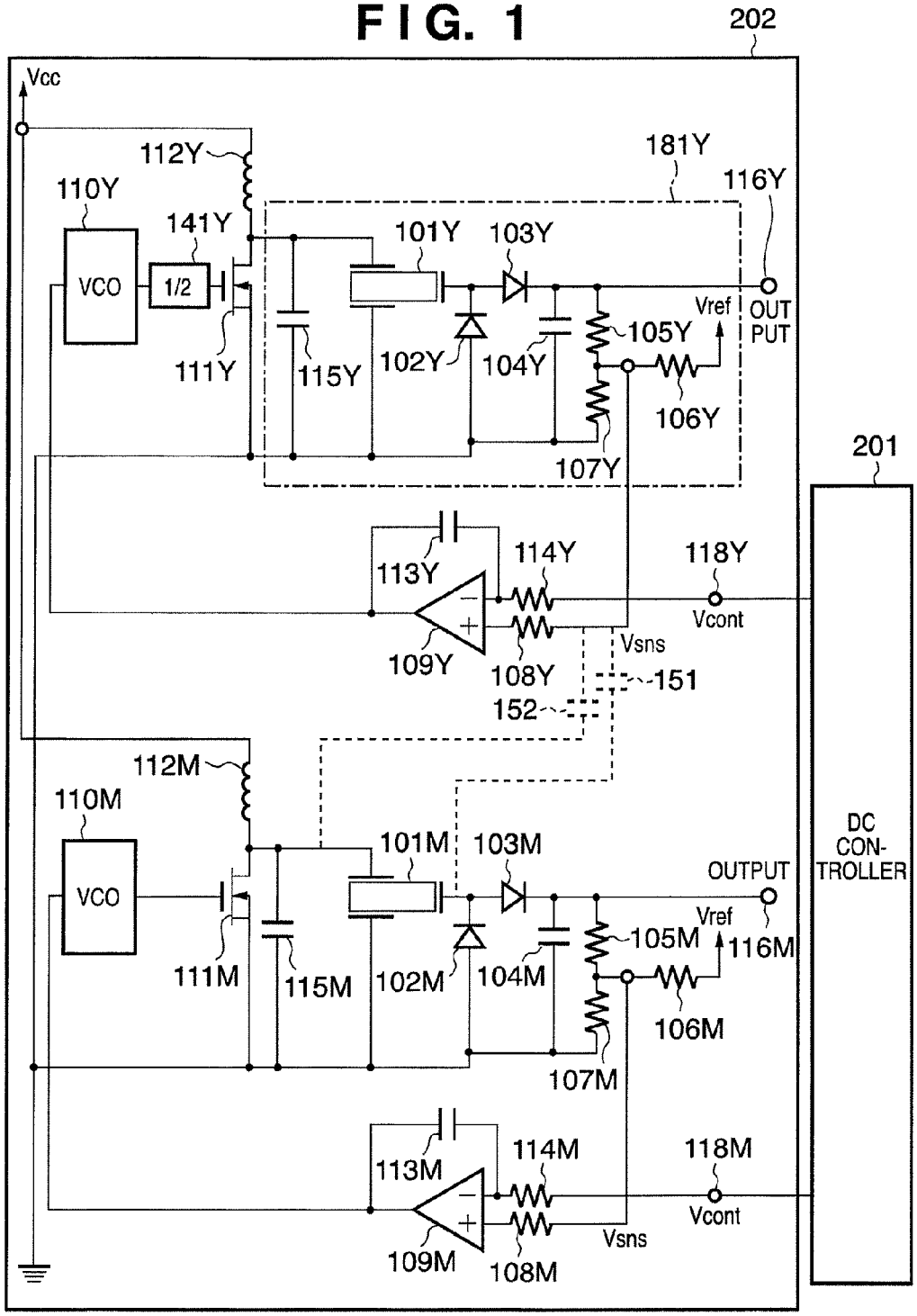
FIG. 1 is a circuit diagram showing the arrangement of a transfer high-voltage power supply using a piezoelectric transformer according to the first embodiment.

In FIG. 1, reference numeral 101M denotes a piezoelectric transformer (piezoelectric ceramic transformer) for a high-voltage power supply. Diodes 102M and 103M and a high-voltage capacitor 104M rectify and smooth an output from the piezoelectric transformer 101N to a positive voltage, and an output terminal 116M supplies it to a transfer roller (not shown) serving as a load. Resistors 105M, 106M, and 107M divide the output voltage, and the non-inverting input terminal (positive terminal) of an operational amplifier 109M receives it via a protection resistor 108M. The inverting input terminal (negative terminal) of the operational amplifier receives, via a series resistor 114M, a high-voltage power supply control signal Vcont which serves as an analog signal from the DC controller 201 and is input from a connection terminal 1 18M. The operational amplifier 109M, the resistor 114M, and a capacitor 113M constitute an integrating circuit.

The output terminal of the operational amplifier 109M is connected to a voltage-controlled oscillator (VCO) 11CM. The output terminal of the voltage-controlled oscillator 110M is connected to the gate of a field effect transistor 111M. The drain of the field effect transistor 111M is connected to a power supply (+24 V: Vcc) via an inductor 112M, grounded via a capacitor 115M, and connected to one electrode of the piezoelectric transformer 101M on the primary side. The other electrode on the primary side is grounded. The source of the field effect transistor 111M is also grounded.

Figure 4:
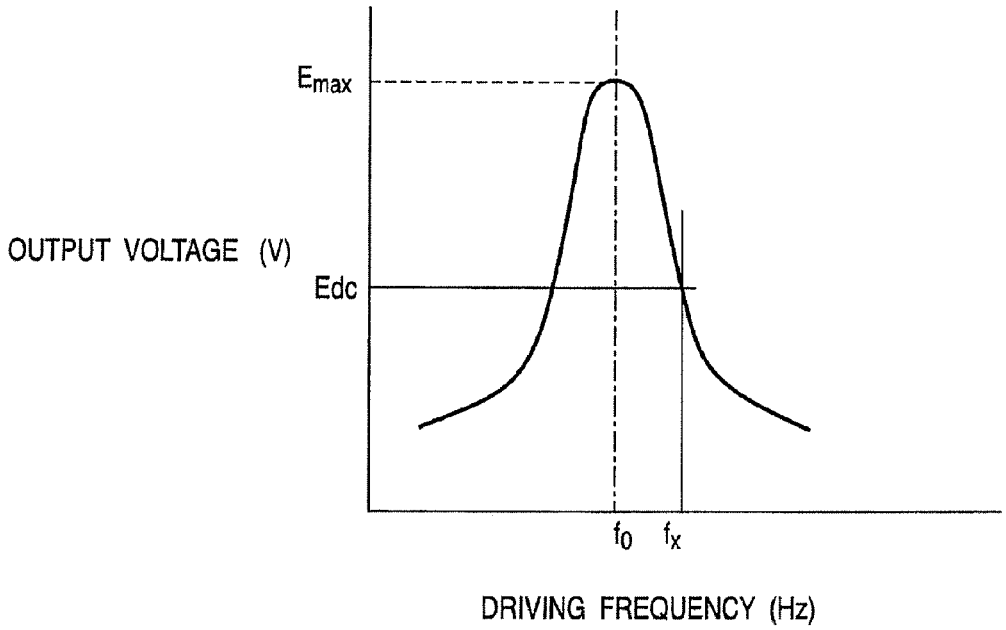
FIG. 4 is a graph showing the relationship between the output voltage (V) and the driving frequency (Hz) as a characteristic of the piezoelectric transformer.

FIG. 4 is a graph showing the relationship between the output voltage (V) and the driving frequency (Hz) as a characteristic of the piezoelectric transformer. As the characteristic of the piezoelectric transformer, the output voltage generally reaches a maximum voltage Emax at a resonance frequency $f_0$ as shown in FIG. 4. At a driving frequency fx, the piezoelectric transformer outputs a specified output voltage (to be also referred to as a "control output voltage" hereinafter) Edc. The distribution of the output voltage (V) forms a bell shape using, as the center, the resonance frequency (to be also referred to as a "maximum frequency" hereinafter) $f_0$. Changing the driving frequency can control the output voltage. For example, to increase the output voltage of the piezoelectric transformer, the driving frequency changes from a higher driving frequency to a lower one toward the resonance frequency $f_0$. In the following description, control is done at a frequency higher than the resonance frequency $f_0$. The same also applies to control at a lower frequency.

The voltage-controlled oscillator (VCO) 110M operates to increase the output frequency when the input voltage rises, and decrease it when the input voltage drops. When the control output voltage Edc of the piezoelectric transformer 101M rises, an input voltage Vsns at the non-inverting input terminal (positive terminal) of the operational amplifier 109M rises due to the resistor 105M, and the voltage at the output terminal of the operational amplifier 109M also rises. Since the input voltage of the voltage-controlled oscillator 110M rises, its output frequency increases, and the driving frequency of the piezoelectric transformer 100M also increases. Hence, the piezoelectric transformer 101M is driven at a frequency higher than the driving frequency fx. Since the output voltage of the piezoelectric transformer 101M drops as the driving frequency fx increases, the output voltage is controlled to a lower one. That is, the arrangement in FIG. 1 forms a negative feedback control circuit.

When the control output voltage Edc of the piezoelectric transformer 101M drops, the input voltage Vsns of the operational amplifier 109M also drops, as does the voltage at the output terminal of the operational amplifier 109M. Since the input voltage of the voltage-controlled oscillator (VCO) 110M drops, its output frequency decreases, and the driving frequency of the piezoelectric transformer 101M also decreases. Since the output voltage of the piezoelectric transformer 101M rises as the driving frequency fx decreases, the output voltage is controlled to a higher one.

In this fashion, the output voltage is controlled to a constant voltage so as to be equal to a voltage determined by the voltage of the control signal Vcont which is input from the DC controller 201 to the inverting input terminal (negative terminal) of the operational amplifier 109M.

In normal printing operation corresponding to the four, yellow (Y), magenta (M), cyan (C), and black (BK) colors, high-voltage circuits, i.e., piezoelectric transformers operate at almost the same timing sin correspondence with the four, Y, M, C, and BK colors. In order to explain a feature of the first embodiment, the operation of two circuits for yellow (Y) and magenta (M) will be explained.

As preparation for explanation, the schematic mechanism of the occurrence of interference between two high-voltage circuits for yellow (Y) and magenta (M) will be described below with reference to FIG. 3.

Figure 3:
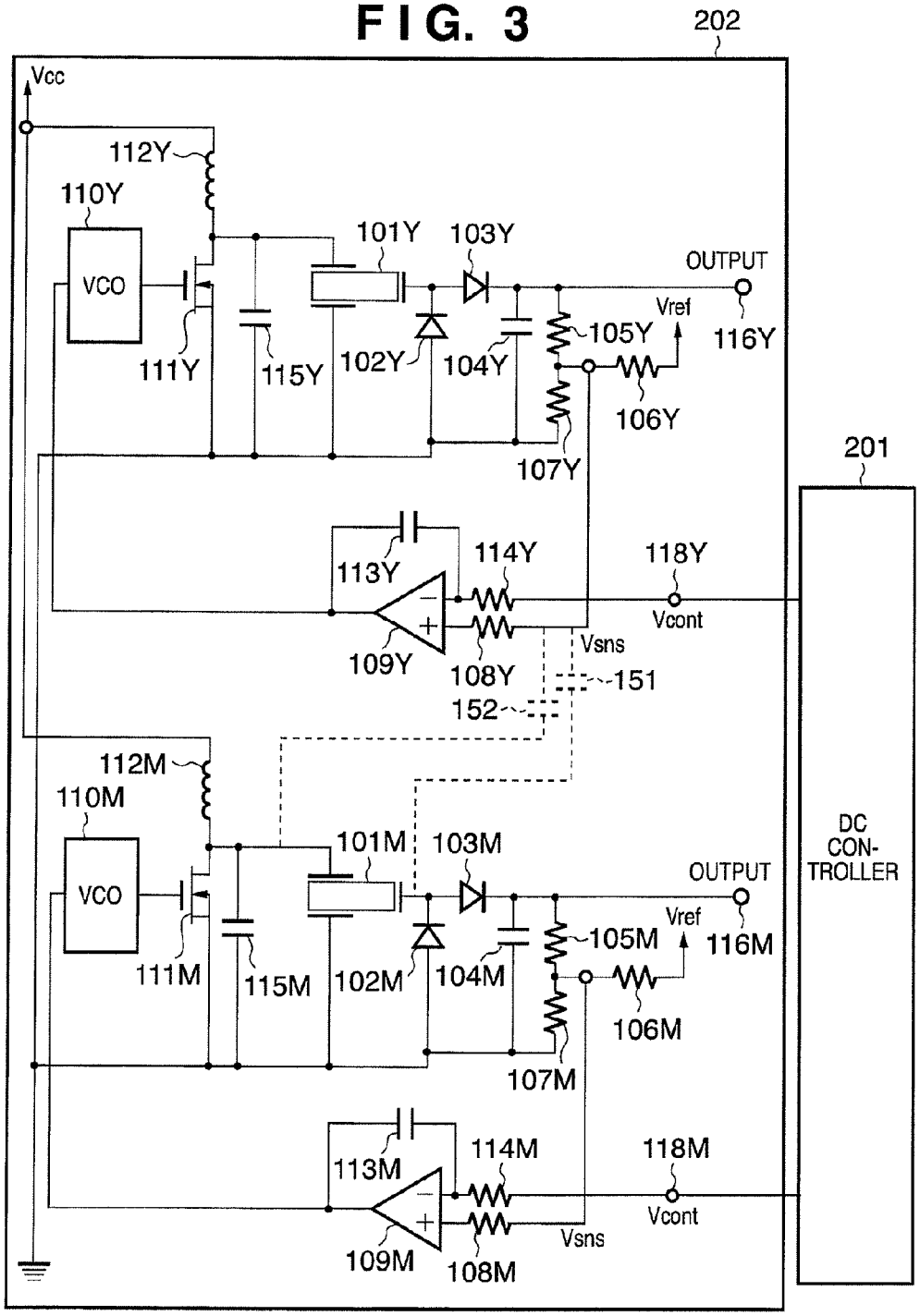
FIG. 3 is a circuit diagram for explaining the schematic mechanism of the occurrence of interference, and showing the arrangement of the transfer high-voltage power supply using the piezoelectric transformer.
Figure 5:
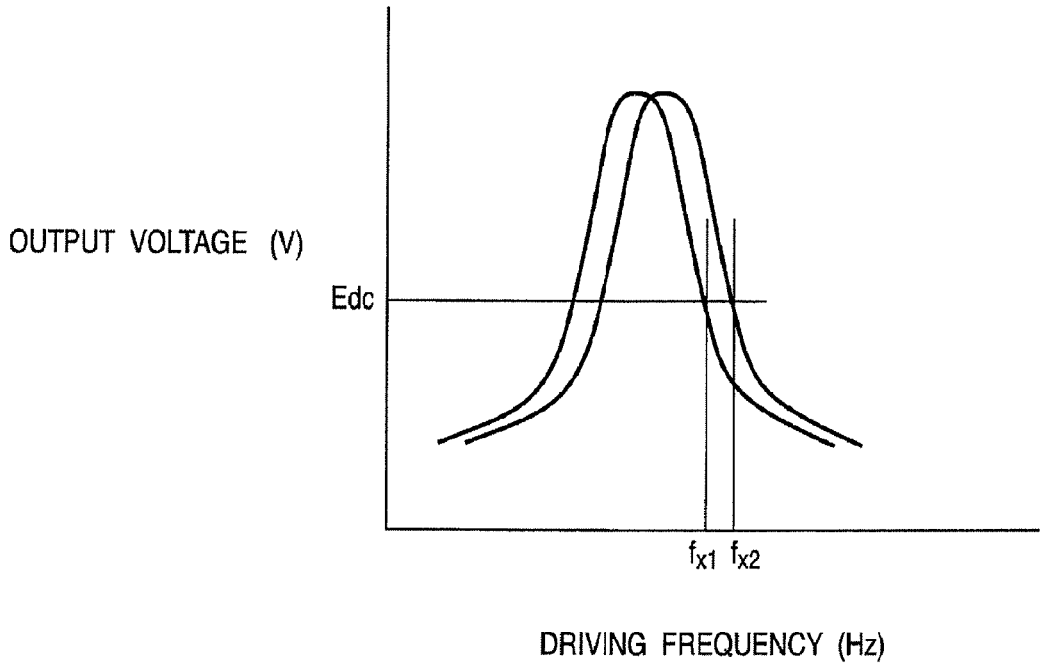
FIG. 5 is a graph showing the relationship between the driving frequencies fx1 and fx2 (Hz) and the output voltage (V)

The piezoelectric transformer 101Y in the Y-station high-voltage circuit in FIG. 3 is driven at a driving frequency fx1 as shown in FIG. 5, and the piezoelectric transformer 101M in the M-station high-voltage circuit is driven at a driving frequency fx2 as shown in FIG. 5.

A line to which resistors 105Y, 106Y, 107Y, and 108Y are connected comprises an output voltage detection line for detecting the output voltage of an operational amplifier 109Y which controls the voltage of a piezoelectric transformer 101Y in the Y-station high-voltage circuit.

The output voltage detection line of the operational amplifier 109Y is arranged close to the driving signal line including 112M, 111M, and 115M and the rectifier circuit connection line including 102M, 103M, 104M, and the like of the piezoelectric transformer 101M in the M-station high-voltage circuit. In this case, capacitors 151 and 152 represented by broken lines are connected between the Y- and M-station high-voltage circuits to form a circuit model.

The output voltage detection line of the operational amplifier 109Y which controls the voltage of the piezoelectric transformer 101Y in the Y-station high-voltage circuit generally drops a high-voltage output (about 1 KV) to a circuit voltage (about 5 V). Hence, the impedance of this connection line becomes higher than that of the other circuit, thereby increasing the influence of interference.

A voltage-controlled oscillator 110Y in the Y-station high-voltage circuit receives, via the operational amplifier 109Y, the control frequency component fx2 of the piezoelectric transformer 101M in the M-station high-voltage circuit, in addition to the control frequency fx1 of the piezoelectric transformer 101Y.

The frequency fx1 input to the VCO circuit 110Y in the Y-station high-voltage circuit is influenced by the frequency fx2 for controlling the piezoelectric transformer 101M in the M-station high-voltage circuit, and a ripple voltage at the interference frequency appears in the output voltage. The interference frequency represents the difference between the driving frequencies of the piezoelectric transformers. Referring to FIGS. 3 and 5, the interference frequency is given as the absolute value of the driving frequency difference corresponding to the control output voltage Edc:

$$\text{interference frequency } Fb=|fx1-fx2| \tag{1}$$

This interference causes a change in the transfer efficiency between yellow (Y) and magenta (M). This influence may appear as a visually recognized cycle in an image in accordance with the relationship with the process speed PS (mm/S) of the image forming apparatus, and degrade the image quality.

An interference image cycle Tb (mm) which may appear in an image in accordance with the process speed PS (mm/S) and the interference frequency Fb is given by $$Tb=\text{process speed } PS/\text{interference frequency } Fb \tag{2}$$

It is generally said that the interference image cycle Tb (mm) can be visually recognized when it becomes 0.3 mm or more. The interference image cycle causes a decrease in the quality of a printed image. For the process speed PS=100 mm/S and the interference frequency Fb≤300 Hz, the pitch which can be visually recognized as density unevenness in the printed image becomes 0.3 mm or more.

For the frequency fx1=163 kHz and the frequency fx2=163.2 kHz, the interference frequency is given from the relationship of equation (1):

$$\begin{aligned}\text{interference frequency } Fb &= |163-163.2| \\ &= 200 \text{ Hz}\end{aligned} \tag{3}$$

For the interference frequency Fb=200 Hz and the process speed PS=100 mm/S, the pitch of density unevenness in the printed image is given by:

$$Tb=100/200=0.5 \text{ mm} \tag{4}$$

The circuit arrangement of the power supply apparatus according to this embodiment of the present invention will be described below with reference to FIG. 1. The power supply apparatus according to this embodiment includes a plurality of power supply circuits each having a piezoelectric transformer and a voltage-controlled oscillator (VCO) which generates a signal at an operating frequency used to drive the piezoelectric transformer in accordance with a control signal. The power supply apparatus includes a frequency-dividing circuit which divides the operating frequency generated by the voltage-controlled oscillator (VCO) in at least one power supply circuit, and outputs a signal at a driving frequency used to drive the piezoelectric transformer in one power supply circuit. When at least one power supply circuit and remaining power supply circuits output voltages, the operating frequency generated by the voltage-controlled oscillator in one power supply circuit is controlled to be higher than the driving frequency.

The circuit shown in FIG. 1 is different from the circuit used to explain an interference model in FIG. 3 in that a frequency-dividing circuit 141Y is arranged between the voltage-controlled oscillator (VCO) 110Y and a piezoelectric transformer driving FET 111Y in the Y-station high-voltage circuit. For example, the frequency division ratio of the frequency-dividing circuit 141Y is set to 2. Accordingly, the voltage-controlled oscillator (VCO) circuit 110Y operates at an operating frequency twice the driving frequency of the piezoelectric transformer 101Y. When the frequency division ratio of the frequency-dividing circuit 141Y is K (=1, 2, 4, 8, . . . ), the voltage-controlled oscillator (VCO) circuit 110Y operates at an operating frequency K times the driving frequency of the piezoelectric transformer 101Y.

In accordance with the relationship between the operating frequency of the voltage-controlled oscillator (VCO) and the driving frequency of the piezoelectric transformer 101Y, the frequency division ratio can be given by $$\text{frequency division ratio } K = \text{operating frequency of voltage-controlled oscillator/driving frequency of piezoelectric transformer} \quad (5)$$

Of course, the frequency division ratio shown in FIG. 1 is not limited to "2", but can be set in accordance with the circuit arrangement, the operating frequency of the voltage-controlled oscillator, and the driving frequency of the piezoelectric transformer.

In the circuit arrangement shown in FIG. 1, similar to FIG. 3, the line to which the resistors 105Y, 106Y, 107Y, and 108Y are connected comprises the output voltage detection line for detecting the output voltage of the operational amplifier 109Y which controls the voltage of the piezoelectric transformer 101Y in the Y-station high-voltage circuit. The output voltage detection line of the operational amplifier 109Y is arranged close to the driving signal line including 112M, 111M, and 115M and rectifier circuit connection line including 102M, 103M, 104M, and the like of the piezoelectric transformer 101M in the M-station high-voltage circuit. The capacitors 151 and 152 are connected between the Y- and M-station high-voltage circuits to form the circuit model.

The voltage-controlled oscillator 110Y in the Y-station high-voltage circuit operates at a frequency (operating frequency) twice the driving frequency of the piezoelectric transformer 101Y. The frequency-dividing circuit 141Y divides the operating frequency by 2 (½ times), and outputs it to the piezoelectric transformer 101Y via the FET 111Y. The piezoelectric transformer 101Y is driven based on the input frequency. Diodes 102Y and 103Y and a high-voltage capacitor 104Y rectify and smoothen the output from the piezoelectric transformer 101Y, and a high-voltage circuit 181Y outputs a high-voltage output bias via an output terminal 116Y.

The resistors 105Y, 106Y, and 107Y divide the output voltage, and output it to the non-inverting input terminal (positive terminal) of the operational amplifier 109Y via the protection resistor 108Y. Additionally, the capacitors 151 and 152 represented by broken lines superimpose and input a voltage component based on the driving frequency fx2 of the piezoelectric transformer 101M in the M-station high-voltage circuit.

The inverting input terminal (negative terminal) of the operational amplifier receives a high-voltage power supply control signal Vcont serving as an analog signal, from the DC controller 201 via a connection terminal 118Y and series resistor 114Y. When dividing the frequency by K (frequency division ratio K (=1, 2, 4, 8, . . . )), the DC controller 201 can output the high-voltage power supply control signal corresponding to the frequency division ratio K to the inverting input terminal (negative terminal).

It is well known that when a spurious component (a component generated by interference between circuits) of the signal whose frequency has not been divided is −A (dB), the spurious component becomes $-A-20\cdot\log K$ (dB) after dividing the frequency of the signal by K, thereby reducing the influence of the spurious component by K.

Figure 6:
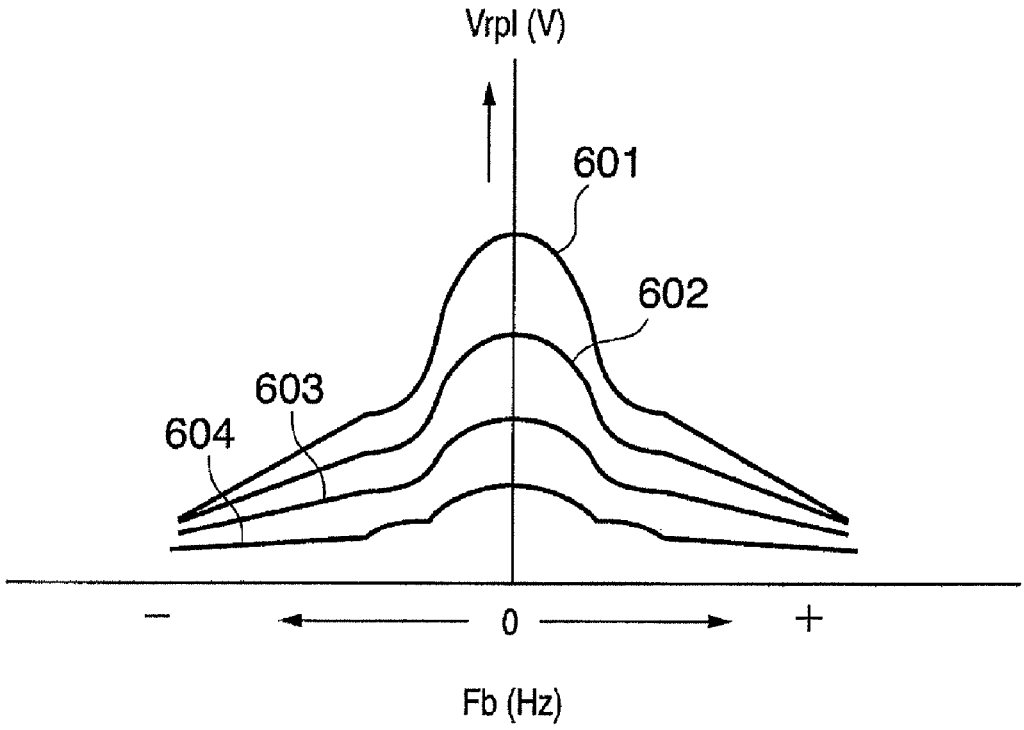
FIG. 6 is a graph showing effects obtained when the transfer high-voltage power supply includes a frequency-dividing circuit according to the first embodiment.

FIG. 6 is a graph showing the effects obtained when the transfer high-voltage power supply includes the frequency-dividing circuit 141Y according to the first embodiment. Reference numeral 601 in FIG. 24 denotes a ripple voltage Vrp1 in the output voltage as a function of the interference frequency Fb (Hz) between the frequencies fx1 and fx2 without performing frequency division. The ripple voltage 602 is obtained by dividing the frequency by 2, a ripple voltage 603 is obtained by dividing the frequency by 4, and a ripple voltage 604 is obtained by dividing the frequency by 8. Referring to FIG. 6, the frequency-dividing circuit 141Y is arranged to drop the ripple voltage Vrp1. The higher the frequency division ratio, the flatter the peak of the ripple voltage. That is, the frequency-dividing circuit 141 Y is arranged to reduce the influence of the spurious component. The frequency-dividing circuit 141 Y whose frequency division ratio is 2 is arranged to decrease the spurious component of the output voltage of the voltage-controlled oscillator (VCO circuit) 110Y to about ½, and halve the ripple voltage value output from the output terminal 116Y.

Although the frequency division ratio of a frequency-dividing circuit 141 is set to "2" in the circuit arrangement of the power supply apparatus according to this embodiment, the frequency division ratio can be set to 1, 2, 4, 8, . . . as described above with reference to FIG. 6. Although the Y-station high-voltage circuit includes the frequency-dividing circuit 141Y in this embodiment, the M-, C-, and BK-station high-voltage circuits may include respective frequency-dividing circuits. In this case, the frequency division ratios of the frequency-dividing circuits can be different from each other.

In the power supply apparatus according to this embodiment, even when driving the piezoelectric transformers 101Y and 101M in the high-voltage circuits at close frequencies, the output ripple voltage value can decrease so as to form a preferable image with a small influence from interference.

Additionally, this embodiment can provide a power supply apparatus using the piezoelectric transformers which suppress the influence of interference between the driving frequencies of the piezoelectric transformers, implement downsizing and a high image quality, and require no experimental measure.

Second Embodiment

In the first embodiment, the high-voltage circuit with the frequency-dividing circuit, e.g., 141Y can effectively decrease the output ripple voltage value. In the second embodiment, an engine controller (DC controller) 201 can set the frequency division ratio of a frequency-dividing circuit.

Figure 7:
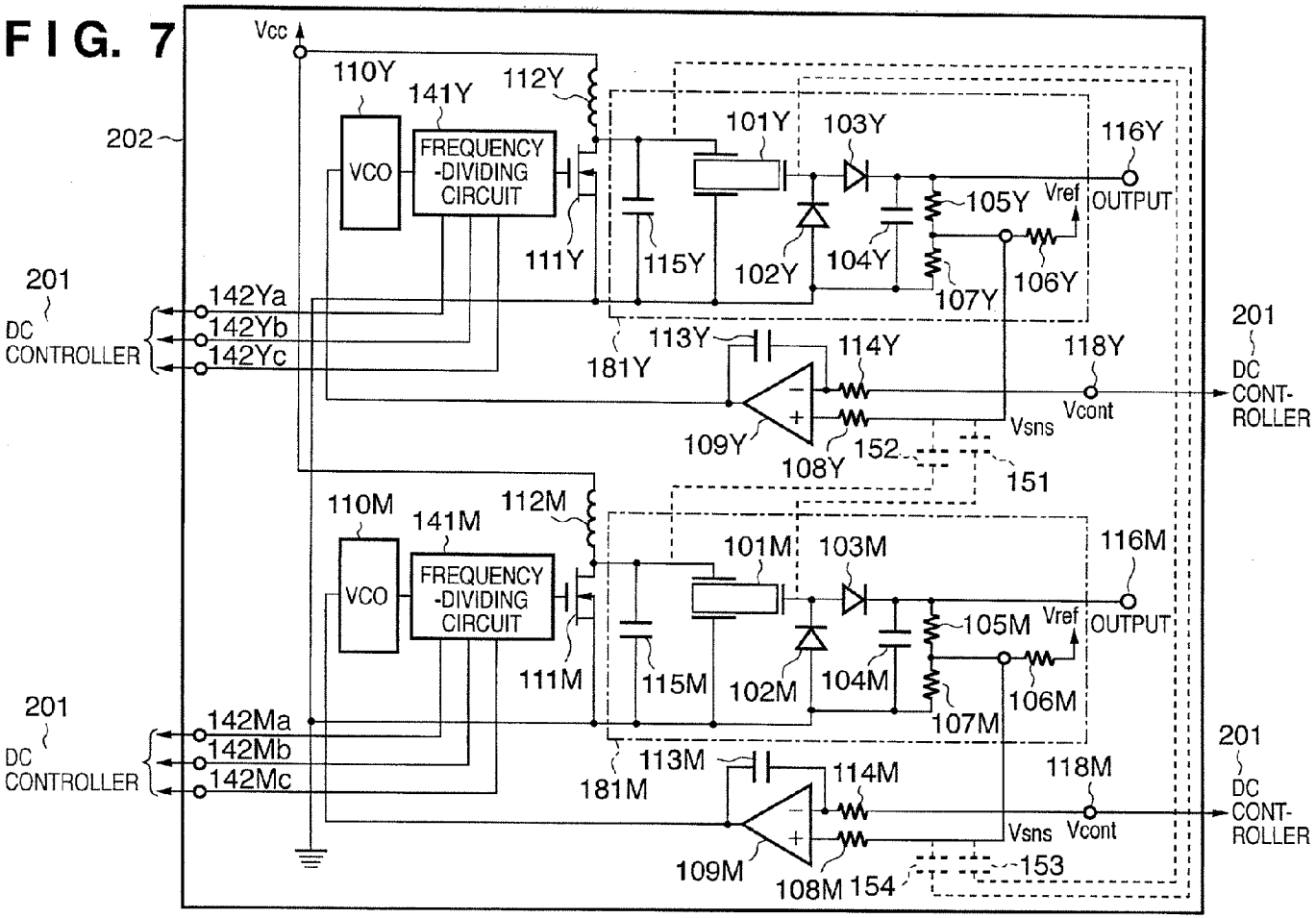
FIG. 7 is a circuit diagram showing the arrangement of a transfer high-voltage power supply using a piezoelectric transformer according to the second embodiment.

FIG. 7 is a circuit diagram showing the arrangement of a transfer high-voltage power supply using a piezoelectric transformer according to the second embodiment. The same reference numerals as in FIG. 1 according to the first embodiment denote the same parts in FIG. 7. In addition, a high-voltage circuit 181M outputs a high-voltage output bias via an output terminal 116M.

The output voltage detection line of an operational amplifier 109Y is arranged close to the driving signal line including 112M, 111M, and 115M and a rectifier circuit connection line including 102M, 103M, 104M, and the like of a piezoelectric transformer 101M in an M-station high-voltage circuit. In this case, capacitors 151 and 152 represented by broken lines are connected between the Y- and M-station high-voltage circuits to form a circuit model. Similarly, the output voltage detection line of the operational amplifier 109M is arranged close to the driving signal line including 112Y, 111Y, and 115Y and a rectifier circuit connection line including 102Y, 103Y, 104Y, and the like of a piezoelectric transformer 101Y in the Y-station high-voltage circuit. Capacitors 153 and 154 represented by broken lines are connected between the M- and Y-station high-voltage circuits to form a circuit model.

A frequency-dividing circuit 141Y connected to a voltage-controlled oscillator (VCO circuit) 110Y in the Y-station high-voltage circuit comprises a circuit capable of setting the frequency division ratio by using an external device, such as a programmable counter. A frequency-dividing circuit 141M connected to a voltage-controlled oscillator (VCO circuit) 110M in the M-station high-voltage circuit also comprises a circuit capable of setting the frequency division ratio by using the external device, such as the programmable counter. The frequency-dividing circuit 141Y includes connection terminals 142Ya, 142Yb, and 142Yc each of which is connected to the output port of an MPU 207 mounted in the DC controller 201. The frequency-dividing circuit 141M also includes connection terminals 142Ma, 142Mb, and 142Mc each of which is connected to the output port of a control element (e.g., the MPU 207) mounted in the DC controller 201. In this embodiment, the MPU 207 is exemplified as a main controller for setting the frequency division ratio. However, the present invention is not limited to this. For example, the same arrangement can be implemented by using an ASIC or other semiconductor device.

FIG. 8 is a table for explaining the setting of the frequency division ratio in the MPU 207 of the DC controller 201. For example, when the frequency division ratios of the frequency-dividing circuits 141Y and 141M are each set to 2, the terminals 142Yc and 142Mc are set ON (ON: 1), and the terminals 142Ya and 142Ma and terminals 142Yb and 142Mb are set OFF (OFF: 0) under the control of the MPU 207. The MPU 207 of the DC controller 201 switches the ON/OFF states of each terminal, thereby setting the frequency division ratio (1, 2, 4, 8, 16, 32, . . . , or the like) of the frequency-dividing circuits 141Y and 141M.

The frequency division ratio is not fixed but can be selected and set from predetermined values (e.g., 1, 2, 4, 8, 16, 32, . . . , and the like), thus increasing the degree of freedom of the types and, especially, the layout of the electronic components to be used when designing the circuit board of the transfer high-voltage power supply.

For example, since the frequency division ratio of each frequency-dividing circuit is set to increase the interference frequency Fb, the interference image cycle Tb can be shortened (equation (2)). This makes it possible to prevent degradation of the quality of a printed image caused by interference of the frequency.

Figure 9A:
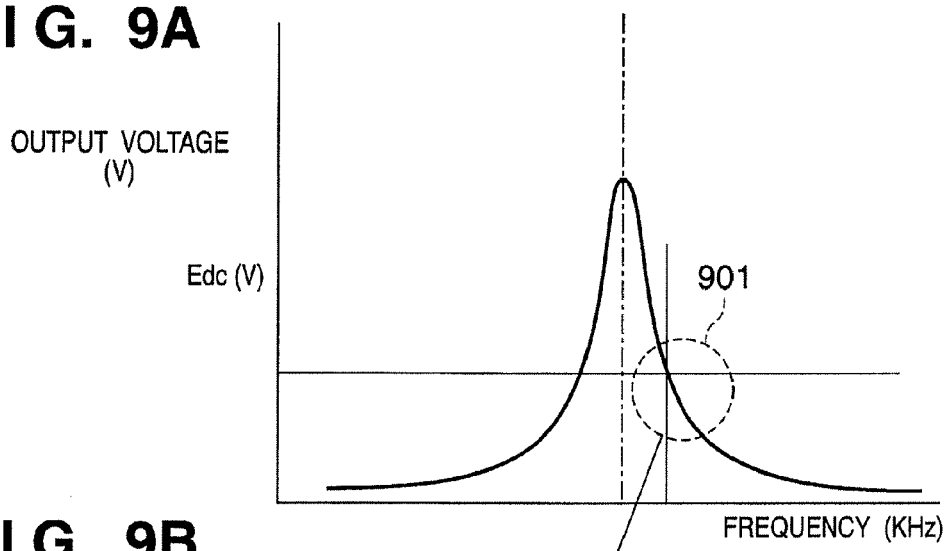
FIG. 9A is a graph showing the relationship between a bias voltage (control output voltage Edc) and a driving frequency.
Figure 9B:
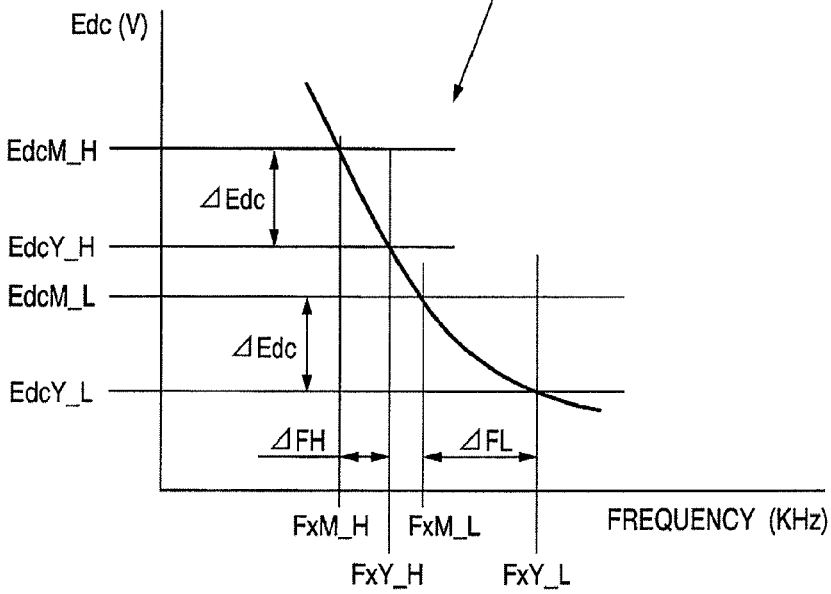
FIG. 9B is a partial enlarged view of an area 901 surrounded by a broken line in FIG. 9A.

FIG. 9A is a graph showing the relationship between a bias voltage (control output voltage Edc) and a driving frequency. FIG. 9B is a partial enlarged view of an area 901 surrounded by a broken line in FIG. 9A. As shown in FIG. 9B, the control output voltage of the Y-station high-voltage circuit is set to EdcY_L, and the control output voltage of the M-station high-voltage circuit is set to EdcM_L. The difference between the control output voltages Edc of two station high-voltage circuits is ΔEdc (see FIG. 9B).

When the Y-station high-voltage circuit outputs the control output voltage EdcY_L, the driving frequency of the piezoelectric transformer 101Y is FxY_L. When the M-station high-voltage circuit outputs the control output voltage EdcM_L, the driving frequency of the piezoelectric transformer 101M is FxM_L. At this time, the difference between the driving frequencies in the Y- and M-station high-voltage circuits is ΔFL.

When the control output voltage of the Y-station high-voltage circuit rises to EdcY_H, and the control output voltage of the M-station high-voltage circuit rises to EdcM_H by environmental variation or the like, the difference between the control output voltages is ΔEdc. At this time, the driving frequencies of the piezoelectric transformers in the respective station high-voltage circuits are FxY_H and FxM_H as shown in FIG. 9B. The difference between the driving frequencies is ΔFH. When comparing the differences of the driving frequencies, ΔFH<ΔFL. That is, when both the control output voltages rise by environmental variation or the like, the difference ΔFH between the driving frequencies decreases. For the difference ΔFH<300 Hz and the process speed PS=100 mm/s, the pitch which can be visually recognized as density unevenness in a printed image becomes 0.3 mm or more (see equation (2)), and density unevenness occurs in a printed image.

In order to prevent density unevenness in the printed image when the driving frequency difference ΔFH<300 Hz, the MPU 207 can set the frequency division ratios of the frequency-dividing circuits 141Y and 141M in accordance with the setting example shown in FIG. 8. The output ripple voltage value decreases by setting the frequency division ratio (e.g., changing the frequency division ratio from 1 to 2) to form a preferable image with a small influence of interference of the driving frequency.

Assume that the driving frequency difference ΔFL=500 Hz while the frequency division ratios of the frequency-dividing circuits in the Y- and M-station high-voltage circuits are set to "1" (142Ya=142Yb=142Yc=0, and 142Ma=142Mb=142Mc=0). In this case, when the driving frequency difference ΔFH=250 Hz by environmental variation, the MPU 207 sets the frequency division ratio of the frequency-dividing circuit 141Y in the Y-station high-voltage circuit to "2" (142Ya=142Yb=0, and 142Yc=1). The output ripple voltage value can be decreased by switching the setting of the frequency division ratio from "1" to "2" (see FIG. 6). That is, when the driving frequency difference decreases, the MPU 207 sets a higher frequency division ratio to reduce the interference energy and decrease the influence of the output ripple voltage value.

The setting of the frequency division ratio can be controlled by storing, in a table, the frequency division ratio to be set for the driving frequency difference ΔEdc to each frequency-dividing circuit in advance. When changing the setting of the frequency division ratio, the operating frequencies of the voltage-controlled oscillators (VCO circuits) 110Y and 110M can change depending on the setting of the frequency division ratio. In this case, the DC controller 201 can input the high-voltage power supply control signal corresponding to the frequency division ratio to the inverting input terminal (negative terminal).

In this embodiment, the frequency division ratio is not fixed but can change, thus increasing the degrees of freedom of the types and, especially, the layout of the electronic components to be used when designing the circuit board of the transfer high-voltage power supply.

Alternatively, in this embodiment, since the frequency division ratio is set depending on the layout of the electronic components and the operation state of the circuit, the output ripple voltage drops to form a preferable image with a small influence of interference.

Additionally, this embodiment can provide a power supply apparatus using piezoelectric transformers which suppress the influence of interference between the driving frequencies of the piezoelectric transformers, implement downsizing and a high image quality, and require no experimental measurements.

Third Embodiment

In the second embodiment, the engine controller (DC controller) 201 can set the frequency division ratio of the frequency-dividing circuit. In the third embodiment, detecting circuits 143Y and 143M detect the magnitudes of the interference frequency components of the driving frequency of a piezoelectric transformer in one power supply circuit, and the driving frequency of a piezoelectric transformer in the other power supply circuit. In the following description, the setting of the frequency division ratio of the frequency-dividing circuit is controlled based on the detection result obtained by the detecting circuit 143Y or 143M.

Figure 10:
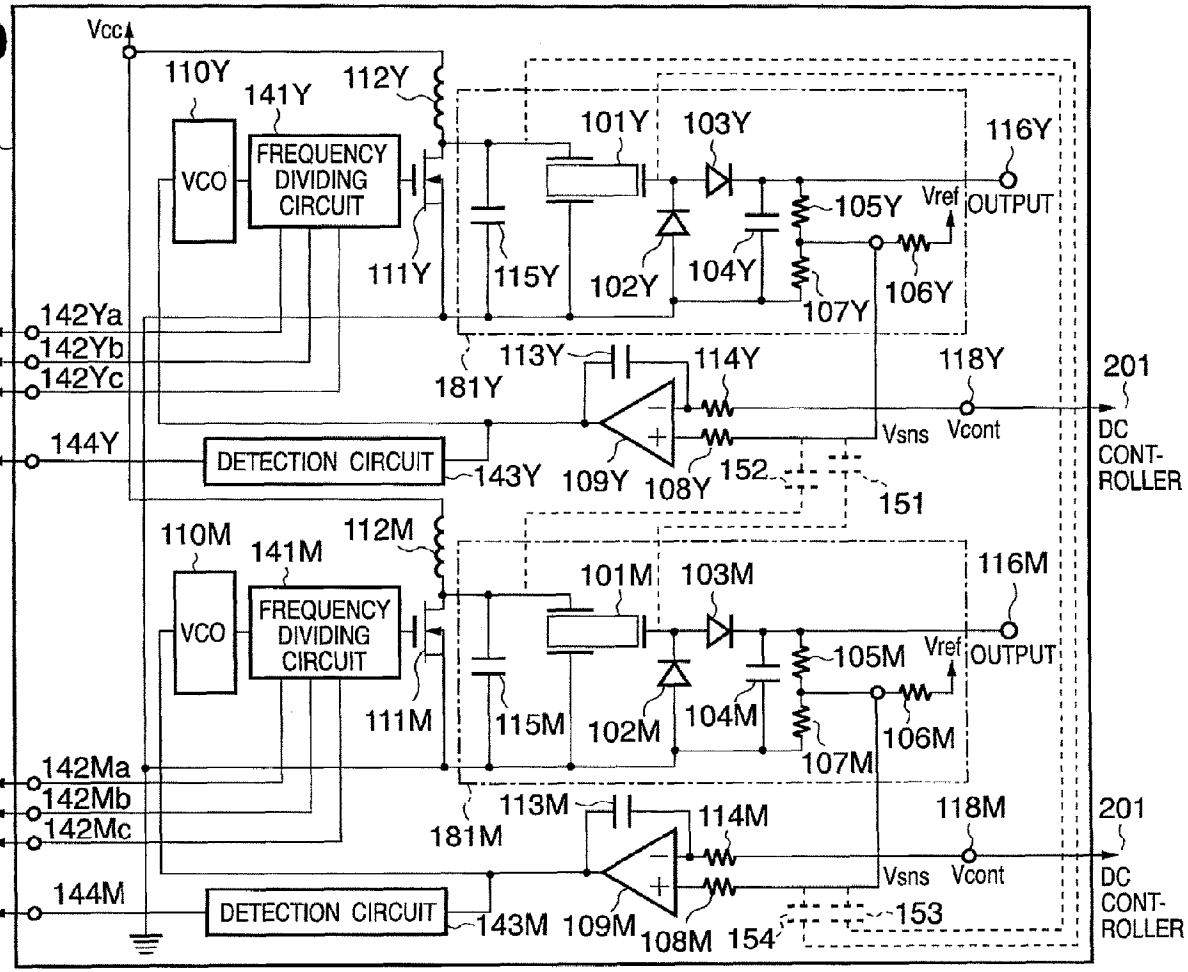
FIG. 10 is a circuit diagram showing the arrangement of a transfer high-voltage power supply using a piezoelectric transformer according to the third embodiment.

FIG. 10 is a circuit diagram showing the arrangement of a transfer high-voltage power supply using a piezoelectric transformer according to the third embodiment. The same reference numerals as in FIG. 7 according to the second embodiment denote the same parts in FIG. 10.

A frequency-dividing circuit 141Y connected to a voltage-controlled oscillator (VCO circuit) 110Y in a Y-station high-voltage circuit comprises a circuit capable of setting the frequency division ratio by using an external device, such as a programmable counter. A frequency-dividing circuit 141M connected to a voltage-controlled oscillator (VCO circuit) 110M in an M-station high-voltage circuit also comprises a circuit capable of setting the frequency division ratio by using the external device, such as the programmable counter.

The frequency-dividing circuit 141Y includes connection terminals 142Ya, 142Yb, and 142Yc each of which is connected to the output port of an MPU 207 mounted in a DC controller 201. The frequency-dividing circuit 141M also includes connection terminals 142Ma, 142Mb, and 142Mc each of which is connected to the output port of a control element (e.g., the MPU 207) mounted in the DC controller 201.

Signals input to the voltage-controlled oscillators (VCO circuits) 110Y and 110M are also input to the detecting circuits 143Y and 143M. The signals processed by the detecting circuits 143Y and 143M are input to the MPU 207 of the DC controller 201 via connection terminals 144Y and 144M respectively.

Figure 11:
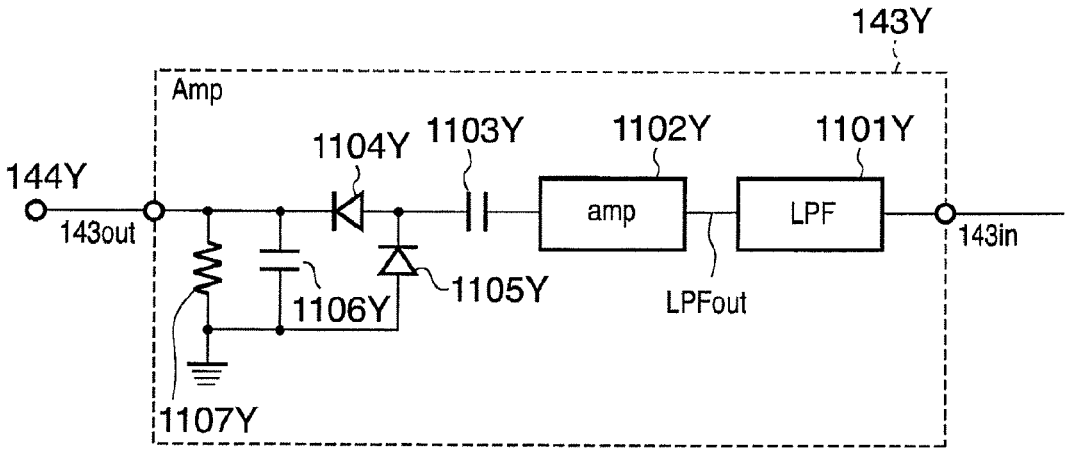
FIG. 11 is a block diagram showing the arrangement of a detecting circuit arranged in a Y-station high-voltage circuit in the transfer high-voltage power supply using the piezoelectric transformer according to the third embodiment.

FIG. 11 is a block diagram showing the arrangement of the detecting circuit 143 mounted in the Y-station high-voltage circuit. Assume that the M-station high-voltage circuit has the same arrangement. In the arrangement shown in FIG. 11, a signal input to the voltage-controlled oscillator (VCO circuit) 110Y is input to the detecting circuit 143Y via a terminal 143in. The detecting circuit 143Y includes a low-pass filter (to be abbreviated as an "LPF" hereinafter) 1101Y having a cutoff frequency of 350 Hz. An amplifier (amp) 1102Y is arranged on the output side of the LPF 1101Y. The amp 1102Y amplifies a signal LPFout from which a high-frequency component has been cut off by the LPF 1101Y, i.e., a signal having only an interference frequency component. A capacitor 1103Y removes the DC component to rectify only the AC component into a DC component by using the rectification circuit made up of 1104Y to 1107Y. The DC signal is output via a terminal 143out, and then input to the MPU 207.

Figure 12A:
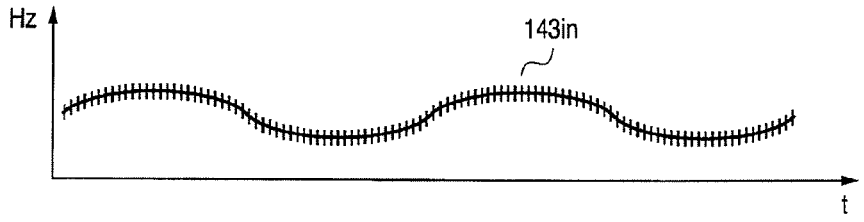
FIG. 12A is a timing chart showing a signal input to a detecting circuit.
Figure 12B:
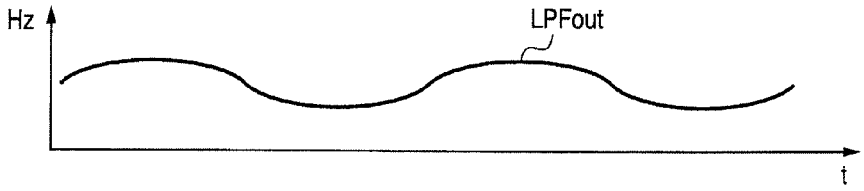
FIG. 12B is a timing chart showing a low-pass filter output obtained by cutting off a high-frequency component.
Figure 12C:
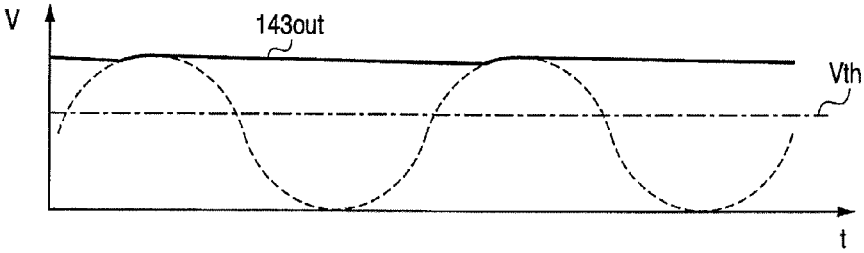
FIG. 12C is a timing chart showing a signal output from the detecting circuit.
Figure 13:
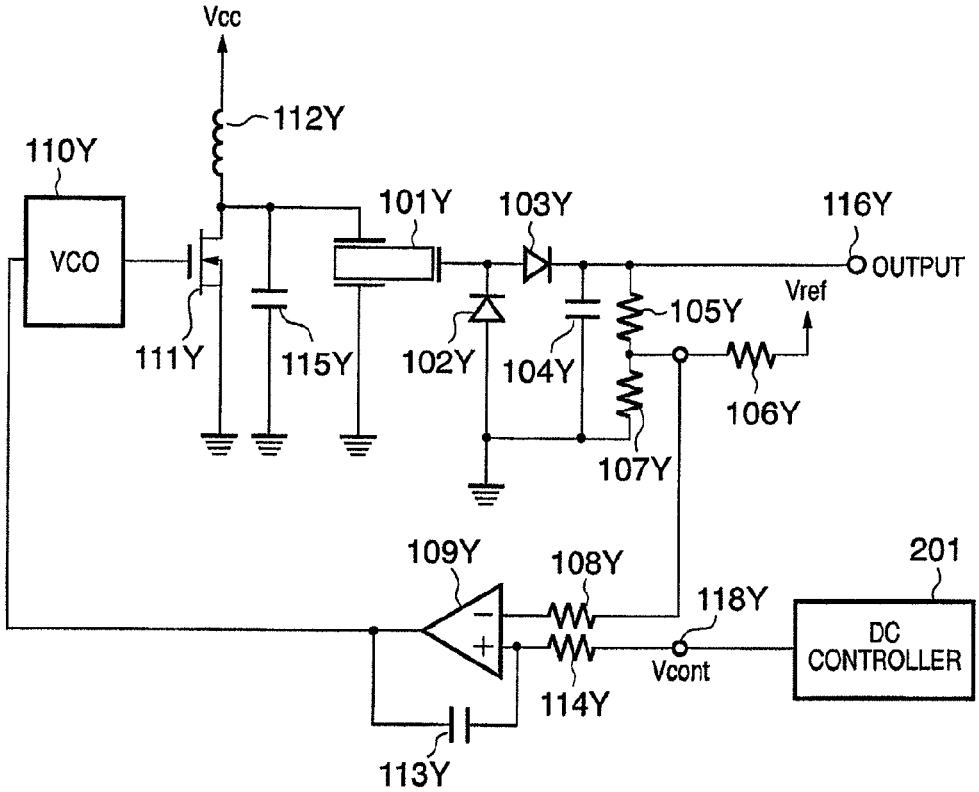
Prior Art FIG. 13
FIG. 13 is a circuit diagram showing a conventional high-voltage power supply circuit using a piezoelectric transformer.

Assume that the frequency division ratios of the frequency-dividing circuits 141Y and 141M are set to 1, the driving frequency fx1 of the piezoelectric transformer 110Y in the Y-station high-voltage circuit is 163 KHz, and the driving frequency fx2 of the piezoelectric transformer 101M in the M-station high-voltage circuit is 163.25 KHz. In this case, a signal having a 250-Hz difference frequency (interference frequency) between the driving frequencies fx1 and fx2 is input as the input signal to the detecting circuit 143Y. The LPF 1101Y cuts off the high-frequency component of 350 Hz or more from the input signal 143in (FIG. 12A) to obtain LPFout (FIG. 12B), and the DC signal 143out shown in FIG. 12C is input to the MPU 207.

The MPU 207 compares the voltage value of the DC signal 143out with a threshold voltage Vth as a reference for changing the setting of the frequency division ratio. If the voltage value of the DC signal 143out is larger than the threshold voltage Vth, the MPU 207 determines that visible density unevenness occurs in a printed image, and changes the setting of the frequency division ratio.

For example, when both of the frequency division ratios of the frequency-dividing circuits in the Y- and M-station high-voltage circuits are set to 1, the MPU 207 sets the frequency division ratio of the frequency-dividing circuit 141Y in the Y-station high-voltage circuit to "2" (142Ya=142Yb=0, and 142Yc=1). As described in the first embodiment, the frequency division ratio can be set by switching the ON/OFF states of the signal applied to each terminal 142Ya, 142Yb, or 142Yc. The output ripple voltage value can be decreased by changing the setting of the frequency division ratio from "1" to "2" (see FIG. 6). That is, when the voltage value obtained by the detecting circuit 143Y is larger than the threshold voltage Vth, the MPU 207 sets a higher frequency division ratio to reduce the interference energy and decrease the influence of the output ripple voltage value.

In the above description, the setting of the frequency division ratio changes in the Y-station high-voltage circuit. When the DC signal voltage value obtained by the detecting circuit 143M is larger than the threshold voltage Vth in the M-station high-voltage circuit, the MPU 207 sets a higher frequency division ratio to reduce the interference energy and decrease the influence of the output ripple voltage value.

When changing the setting of the frequency division ratio, the operating frequencies of the voltage-controlled oscillators (VCO circuits) 110Y and 110M can change depending on the setting of the frequency division ratio. In this case, the DC controller 201 can input a high-voltage power supply control signal to the inverting input terminal (negative terminal) in correspondence with the frequency division ratio. The combination of the high-voltage circuit (station) which detects the magnitude of the interference frequency component by using the detecting circuits 143Y and 143M and the high-voltage circuit (station) which sets the frequency division ratio can be selected under the control of the DC controller. For example, based on the detection results of the magnitudes of the interference frequency components in both the Y- and M-station high-voltage circuits, the settings of the frequency division ratios of one or both of the high-voltage circuits can change.

For the process speed PS=100 mm/S and the interference frequency Fb≤300 Hz, the pitch which can be visually recognized as density unevenness in the printed image becomes 0.3 mm or more. Accordingly, the cutoff frequency of the LPF 1101Y is set to 350 Hz in this embodiment. However, for example, the cutoff frequency can also change in accordance with the process speed PS of the image forming apparatus. The DC controller 201 can also control the cutoff frequency.

In the first to third embodiments, the image forming apparatus has been described by exemplifying the transfer high-voltage power supply used in a color image forming apparatus of a tandem system. However, the image forming apparatus to be applied to the present invention is not limited to the color image forming apparatus, but may be a monochrome image forming apparatus which forms a monochrome image. Any circuit arrangement shown in FIG. 1, 7, or 10 may be applied to the high-voltage power supply apparatus 202 included in the image forming apparatus to reduce the output ripple voltage value and form a preferable image with a small influence of interference.

Note that the circuit arrangement of the transfer high-voltage power supply described in the first to third embodiments may include discrete components or a semiconductor IC. For example, in the circuit arrangement of the transfer high-voltage power supply described in the first to third embodiments, the voltage-controlled oscillator (VCO) and frequency-dividing circuit can include discrete components. In the power supply apparatus in these embodiments, the voltage-controlled oscillator (VCO) and frequency-dividing circuit can also include integrated semiconductor IC devices.

In these embodiments, the setting of the frequency division ratio is not fixed but can change, thus increasing the degree of freedom of the types and, especially, the layout of electronic components to be used when designing the circuit board of the transfer high-voltage power supply.

In these embodiments, since the frequency division ratio is set depending on the layout of the electronic components and the operation state of the circuit, the output ripple voltage drops to form a preferable image with a small influence of interference.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-048978, filed Feb. 24, 2006, which is hereby incorporated by reference herein in its entirety.

What is claimed is:

[1. A power supply apparatus with a plurality of voltage output circuits each having a piezoelectric transformer and an oscillator which generates a signal for driving the piezoelectric transformer and for controlling an output voltage of the piezoelectric transformer, comprising:

a frequency-dividing circuit which divides a frequency of the signal generated by the oscillator in at least one of the plurality of voltage output circuits, and outputs a driving frequency signal for driving the piezoelectric transformer in said at least one voltage output circuit, wherein the frequency of the signal generated by the oscillator in said at least one voltage output circuit is larger than a frequency of the signal generated by the oscillator in another of the plurality of voltage output circuits.]

[2. The apparatus according to claim 1, wherein the frequency-dividing circuit divides the frequency of the signal in accordance with a frequency division ratio which can be arbitrarily set in accordance with a signal from an external device.]

[3. The apparatus according to claim 1, further comprising a detecting circuit which detects a magnitude of an interference frequency, wherein the frequency-dividing circuit divides the frequency of the signal in accordance with a frequency division ratio which is controlled based on the interference frequency.]

[4. The apparatus according to claim 1, wherein the oscillator and the frequency-dividing circuit include discrete components.]

[5. The apparatus according to claim 1, wherein the oscillator and the frequency-dividing circuit include integrated semiconductor IC devices.]

[6. An image forming apparatus comprising:

an image forming unit adapted to form a image; and a power supply unit adapted to output voltages to said image forming unit, wherein said power supply unit comprises a plurality of voltage output circuits each having a piezoelectric transformer and an oscillator which generates a signal for driving the piezoelectric transformer and for controlling an output voltage of the piezoelectric transformer, wherein at least one of the plurality of voltage output circuits has a frequency-dividing circuit which divides the frequency of the signal generated by the oscillator in said at least one voltage output circuit, and wherein the frequency of the signal generated by the oscillator in said at least one voltage output circuit is larger than a frequency of the signal generated by the oscillator in another of the plurality of voltage output circuits.]

[7. The image forming apparatus according to claim 6, wherein said image forming unit includes a plurality of image forming stations, and wherein said plurality of voltage output circuits output voltages to each of said plurality of image forming stations.]

[8. The image forming apparatus according to claim 7, wherein each of said plurality of image forming stations is a circuit for forming a different color image.]

*9. A power supply comprising:*

*a first and a second voltage output part which each include a piezoelectric transformer, a driving part adapted to drive the piezoelectric transformer, and an oscillation part adapted to output a frequency signal for driving the driving part, wherein*

*the first voltage output part outputs a voltage to a first process part which performs a process operation for forming an image, and the second voltage output part outputs a voltage to a second process part which differs from the first process part and performs a process operation for forming the image,*

*wherein the first process part is one of a first charging part adapted to execute a charging operation for charging a first photosensitive member, a first developing part adapted to execute a developing operation for developing a latent image formed on the first photosensitive member, and a first transferring part adapted to execute a transferring operation for transferring an image formed on the first photosensitive member,*

*the second process part is one of a second charging part adapted to execute a charging operation for charging a second photosensitive member, a second developing part adapted to execute a developing operation for developing a latent image formed on the second photosensitive member, and a second transferring part adapted to execute a transferring operation for transferring an image formed on the second photosensitive member,*

*each of the oscillation part of the first voltage output part and the oscillation part of the second voltage output part outputs the frequency signal having a frequency higher than each driving frequency of the driving part of the first voltage output part and the driving part of the second voltage output part,*

*the first voltage output part includes a first frequency-dividing part adapted to divide the frequency signal output from the oscillation part of the first voltage output part,*

*the second voltage output part includes a second frequency-dividing part adapted to divide the frequency signal output from the oscillation part of the second voltage output part,*

*the driving part of the first voltage output part drives the piezoelectric transformer in accordance with a driving signal output from the first frequency-dividing part, and*

*the driving part of the second voltage output part drives the piezoelectric transformer in accordance with a driving signal output from the second frequency-dividing part.*

*10. The power supply according to claim 9, wherein each of the first and the second voltage output parts includes a feedback part which detects a voltage output from the piezoelectric transformer and controls a frequency of the frequency signal output from the oscillation part in accordance with the detected voltage.*

*11. The power supply according to claim 10, wherein the feedback part detects the voltage output from the piezoelectric transformer as a lower detected voltage and feeds back the lower detected voltage to the oscillation part.*

*12. The power supply according to claim 11, wherein the feedback part feeds back, to the oscillation part, a comparison result between the lower detected voltage and a setting signal used for controlling the voltage output from the piezoelectric transformer so as to become a constant voltage.*

*13. The power supply according to claim 9, wherein a frequency of the frequency signal is equal to or more than twice the driving frequency.*

*14. An integrated circuit controls a power supply which comprises a first and a second voltage output part each including a piezoelectric transformer and a driving part adapted to drive the piezoelectric transformer, wherein the first voltage output part outputs a voltage to a first process part which performs a process operation for forming an image, and the second voltage output part outputs a voltage to a second process part which differs from the first process part and performs a process operation for forming the image, and wherein the first process part is one of a first charging part adapted to execute a charging operation for charging a first photosensitive member, a first developing part adapted to execute a developing operation for developing a latent image formed on the first photosensitive member, and a first transferring part adapted to execute a transferring operation for transferring an image formed on the first photosensitive member, the second process part is one of a second charging part adapted to execute a charging operation for charging a second photosensitive member, a second developing part adapted to execute a developing operation for developing a latent image formed on the second photosensitive member, and a second transferring part adapted to execute a transferring operation for transferring an image formed on the second photosensitive member, said integrated circuit further comprising:*

*a first oscillation part adapted to output a frequency signal to the driving part of the first voltage output part;*

*a second oscillation part adapted to output a frequency signal to the driving part of the second voltage output part;*

*wherein each of the oscillation part of the first voltage output part and the oscillation part of the second voltage output part outputs the frequency signal having a frequency higher than each driving frequency of the driving part of the first voltage output part and the driving part of the second voltage output part,*

*a first frequency-dividing part adapted to divide the frequency signal output from the first oscillation part; and*

*a second frequency-dividing part adapted to divide the frequency signal output from the second oscillation part.*

*15. The integrated circuit according to claim 14, wherein each of the first and the second voltage output parts includes a feedback part which detects a voltage output from the piezoelectric transformer and controls a frequency of the frequency signal output from the oscillation part in accordance with the detected voltage.*

*16. The integrated circuit according to claim 15, wherein the feedback part detects the voltage output from the piezoelectric transformer as a lower detected voltage and feeds back the lower detected voltage to the oscillation part.*

*17. The integrated circuit according to claim 15, wherein the feedback part feeds back, to the oscillation part, a comparison result between the lower detected voltage and a setting signal used for controlling the voltage output from the piezoelectric transformer so as to become a constant voltage.*

*18. The integrated circuit according to claim 14, wherein a frequency of the frequency signal is equal to or more than twice the driving frequency.*

*19. An image forming apparatus comprising:*

*a first process part configured to perform a process operation for forming an image;*

*a second process part configured to perform a process operation for forming the image, the second process part being different from the first process part;*

*wherein the first process part is one of a first charging part adapted to execute a charging operation for charging a first photosensitive member, a first developing part adapted to execute a developing operation for developing a latent image formed on the first photosensitive member, and a first transferring part adapted to execute a transferring operation for transferring an image formed on the first photosensitive member, the second process part is one of a second charging part adapted to execute a charging operation for charging a second photosensitive member, a second developing part adapted to execute a developing operation for developing a latent image formed on the second photosensitive member, and a second transferring part adapted to execute a transferring operation for transferring an image formed on the second photosensitive member, and*

*a power supply configured to include a first voltage output part for outputting a voltage to the first process part, and a second voltage output part for outputting a voltage to the second process part,*

*wherein the first and the second voltage output part each include a piezoelectric transformer, a driving part adapted to drive the piezoelectric transformer, and an oscillation part adapted to output a frequency signal for driving the driving part,*

*wherein each of the oscillation part of the first voltage output part and the oscillation part of the second voltage output part outputs the frequency signal having a frequency higher than each driving frequency of the driving part of the first voltage output part and the driving part of the second voltage output part,*

*wherein the first voltage output part includes a first frequency-dividing part adapted to divide the frequency signal output from the oscillation part of the first voltage output part, and*

*the second voltage output part includes a second frequency-dividing part adapted to divide the frequency signal output from the oscillation part of the second voltage output part, and*

*wherein the driving part of the first voltage output part drives the piezoelectric transformer in accordance with a driving signal output from the first frequency-dividing part, and*

*the driving part of the second voltage output part drives the piezoelectric transformer in accordance with a driving signal output from the second frequency-dividing part.*

*20. The image forming apparatus according to claim 19, wherein each of the first and the second voltage output parts includes a feedback part which detects a voltage output from*

*the piezoelectric transformer and controls a frequency of the frequency signal output from the oscillation part in accordance with the detected voltage.*

*21. The image forming apparatus according to claim 20, wherein the feedback part detects the voltage output from the piezoelectric transformer as a lower detected voltage and feeds back the detected voltage to the oscillation part.*

*22. The image forming apparatus according to claim 20, wherein the feedback part feeds back, to the oscillation part, a comparison result between the detected voltage and a setting signal used for controlling the voltage output from the piezoelectric transformer so as to become a constant voltage.*

*23. The image forming apparatus according to claim 19, wherein each of the first process part and the second process part is a part adapted to form a different color image.*

*24. The image forming apparatus according to claim 19, wherein a frequency of the frequency signal is equal to or more than twice the driving frequency.*

* * * * *